United States Patent
Suzuki et al.

(10) Patent No.: US 6,604,234 B2
(45) Date of Patent: Aug. 5, 2003

(54) METHOD OF DESIGNING/ MANUFACTURING SEMICONDUCTOR INTEGRATED CIRCUIT DEVICE USING COMBINED EXPOSURE PATTERN AND SEMICONDUCTOR INTEGRATED CIRCUIT DEVICE

(75) Inventors: Toshio Suzuki, Hatoyama (JP); Mitsuo Usami, Tachikawa (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/864,312

(22) Filed: May 25, 2001

(65) Prior Publication Data

US 2001/0046730 A1 Nov. 29, 2001

(30) Foreign Application Priority Data

May 26, 2000 (JP) ........................................ 2000-156844

(51) Int. Cl.[7] ............................................... G06F 17/50
(52) U.S. Cl. ............................... 716/19; 716/20; 716/21
(58) Field of Search .............................. 716/19, 20, 21

(56) References Cited

U.S. PATENT DOCUMENTS

| 5,253,182 | A | * | 10/1993 | Suzuki ......................... 716/21 |
| 6,187,483 | B1 | * | 2/2001 | Capodieci et al. ............. 716/20 |
| 6,238,824 | B1 | * | 5/2001 | Futrell et al. .................. 716/21 |
| 6,397,377 | B1 | * | 5/2002 | Wang et al. .................... 716/21 |
| 6,416,907 | B1 | * | 7/2002 | Winder et al. ................. 716/19 |

FOREIGN PATENT DOCUMENTS

JP          8-139208          5/1996

* cited by examiner

*Primary Examiner*—Trong Pham
(74) *Attorney, Agent, or Firm*—Antonelli, Terry, Stout & Kraus, LLP

(57) ABSTRACT

In a method of designing/manufacturing a plurality of semiconductor integrated circuit devices having built-in ROMs each storing different data on a single wafer, a ROM pattern is formed in combination with a pattern that is common to a plurality of semiconductor integrated circuit devices other than the ROM pattern.

14 Claims, 12 Drawing Sheets

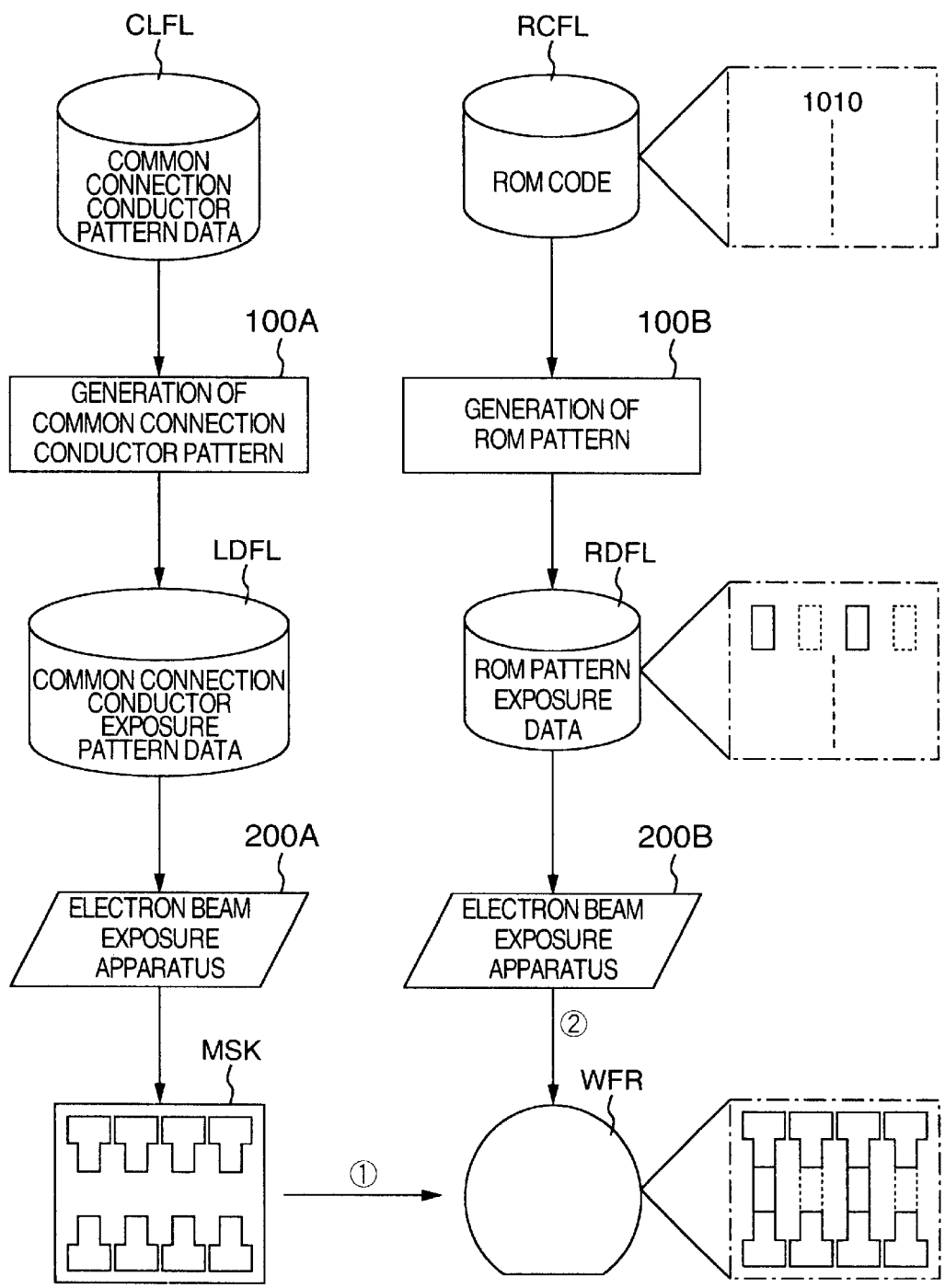

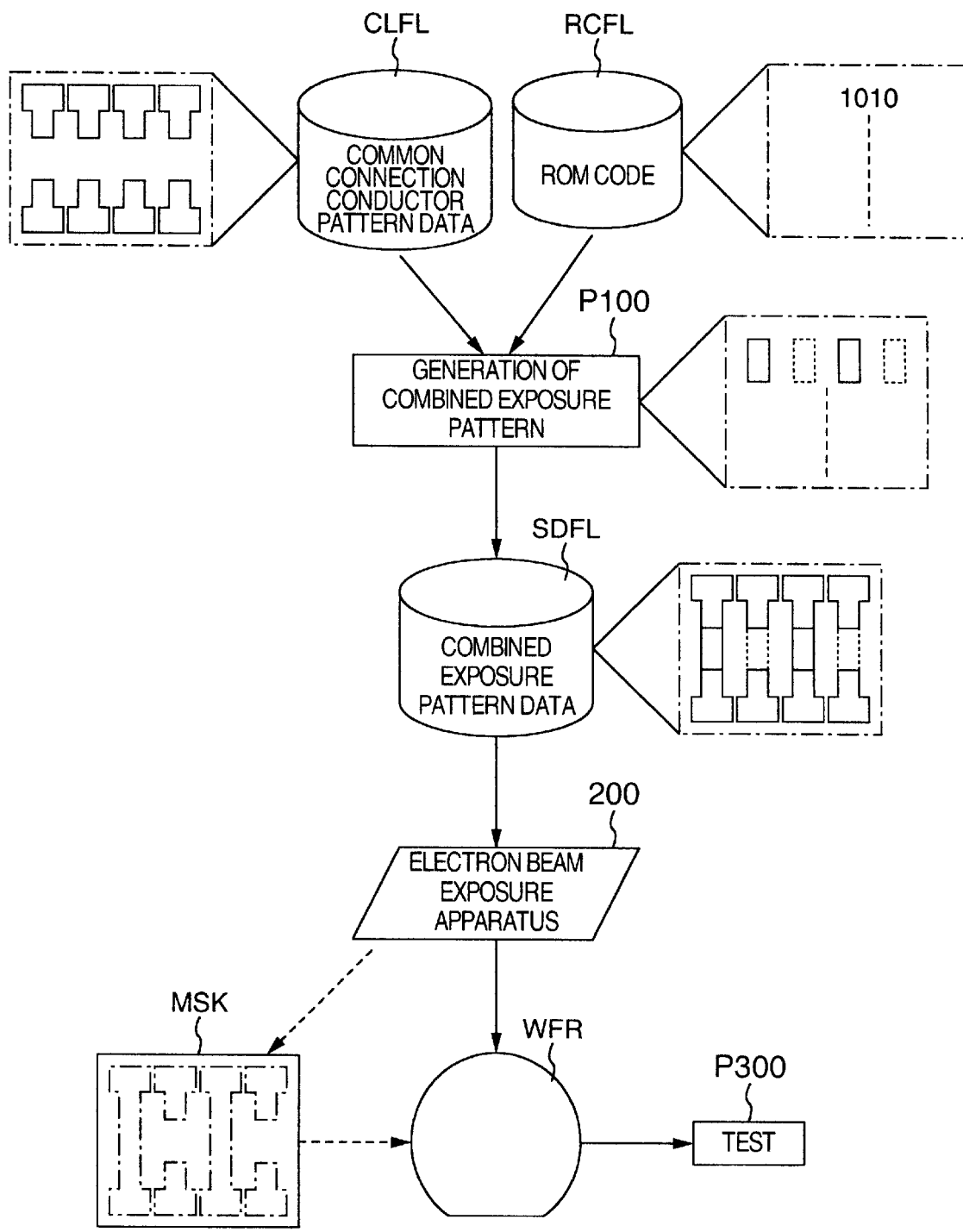

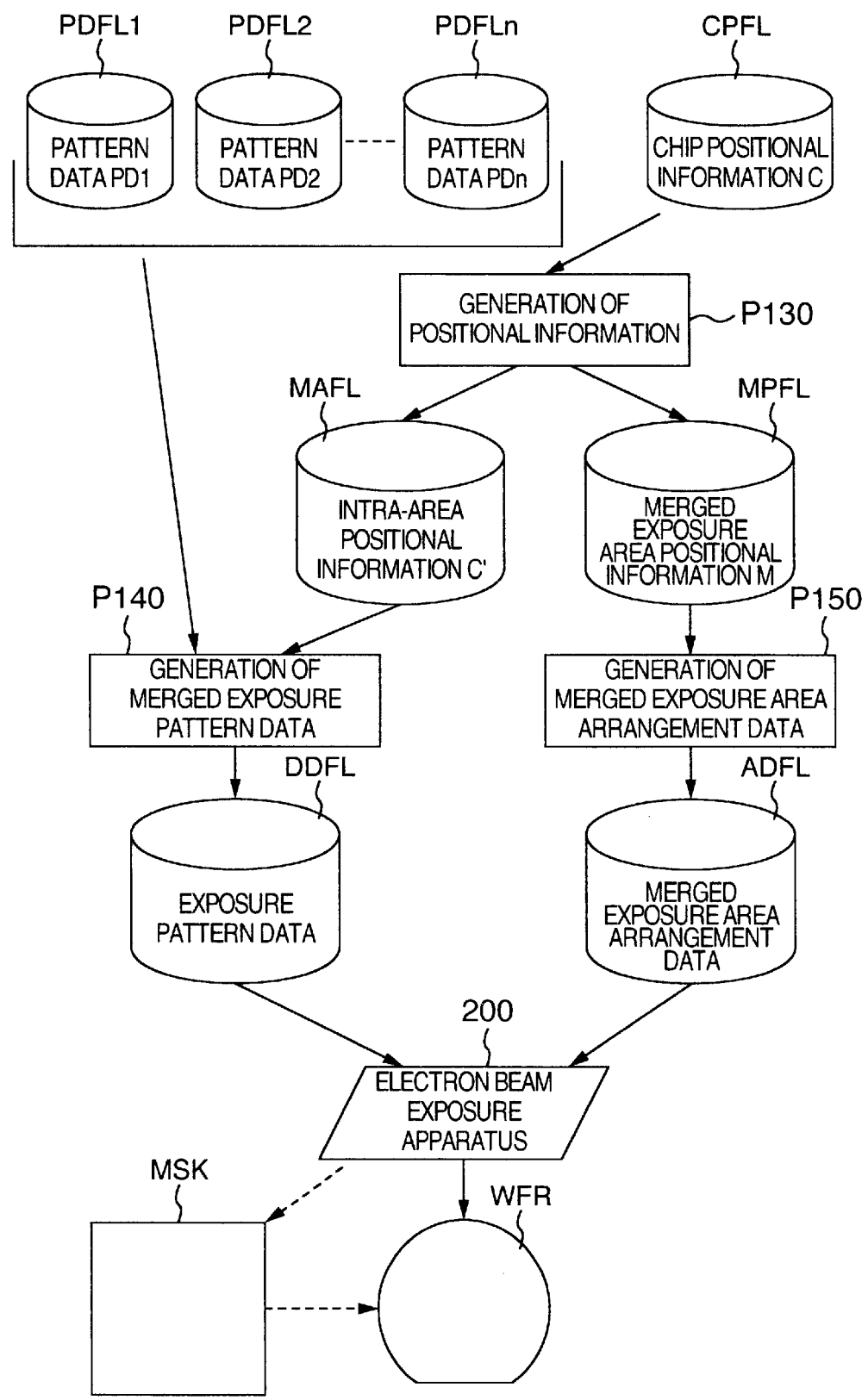

METHOD OF DESIGNING/ MANUFACTURING SEMICONDUCTOR INTEGRATED CIRCUIT DEVICE USING COMBINED EXPOSURE PATTERN AND SEMICONDUCTOR INTEGRATED CIRCUIT DEVICE

BACKGROUND OF THE INVENTION

This invention relates to manufacture of semiconductor integrated circuit devices and to formation of a connection conductor pattern of semiconductor integrated circuits having built-in ROMs (Read-Only Memories). For example, this invention relates to a technology for forming a plurality of semiconductor integrated circuit chips storing an inherent code in each built-in ROM on a wafer.

As disclosed in JP-A-8-139208 (laid open on May 31, 1996), for example, semiconductor integrated circuit devices having ROMs each storing therein inherent data are manufactured by serially conducting first the step of forming a common connection conductor pattern and then the step of writing data to be stored into ROM.

SUMMARY OF THE INVENTION

According to the observation acquired by the present inventors, designing/manufacturing of the semiconductor integrated circuit devices described above can be accomplished by a procedure shown in FIG. 1 of the accompanying drawings.

Referring to FIG. 1, a common connection conductor pattern is read out from a common connection conductor pattern file CLFL to generate a common connection conductor pattern 100A. This pattern 100A is then stored in a common connection conductor pattern exposure data file LDFL.

On the other hand, a ROM code 1010 is read out from a ROM code file RCFL that stores the ROM code to be stored in the ROM of each chip, and a ROM pattern is generated. The ROM pattern 100B is stored in a ROM pattern exposure data file RDFL that is separate from the common connection conductor pattern file CLFL storing the common connection conductor patterns of circuits other than the ROM. An electron beam exposure apparatus 200A exposes first the common conduction conductor patterns of the circuits other than the ROM to generate a mask MSK. The common connection conductor pattern is then formed on a wafer WFR in step 1 by using the mask MSK so formed. The ROM pattern is read out from the ROM pattern exposure data file RDFL and is directly exposed by an electron beam exposure apparatus 200B an a resist film on the wafer WFR in step 2 to form the ROM pattern. In other words, a different step (different metal layer) from that of the common connection conductor pattern is employed to form the ROM pattern.

The technology described above with reference to FIG. 1 is directed to semiconductor integrated circuit devices of the type in which a size of chips formed on a single wafer is at least 10 mm square, and the number of kinds of semiconductor integrated circuits (kinds of models) having different ROM patterns, that determine memory data of ROMs, and formed on a single wafer, is at most 50 to 60 kinds. Therefore, the exposure data quantity handled by the electron beam exposure apparatuses for exposing the ROM patterns is not particularly great, and the existing electron beam exposure apparatus can expose the ROM patterns of all the chips on a single wafer or a single mask.

When developing semiconductor integrated circuit devices having different patterns of ROMs that have chip sizes of not greater than 1 mm square, for example, and are to be built in the semiconductor integrated circuit devices, respectively, the present inventors have studied feasibility of technologies for designing and manufacturing mutually separately common connection conductor patterns of circuits other than ROMs and ROM patterns, and have acquired the following observation. In the case of semiconductor integrated circuit devices having a chip size of not greater than 1 mm square, for example, the technology for designing and manufacturing individually the common connection conductor pattern other than the ROM and the ROM patterns needs an exposure data file number of as great as 50,000 to 600,000 because 50,000 to 600,000 chips need to be formed on a single wafer. Thus, the exposure data quantity becomes as great as 500 GB (giga byte) to 600 GB.

In this case, a large-scale magnetic disk apparatus has to be connected to the electron beam exposure apparatus to store the exposure data. Further, a transfer time to transfer the exposure data from the magnetic disk apparatus to a memory device for exposure gets elongated to one or more days, for example, when exposure is performed. The present inventors have thus clarified that the existing electron beam exposure apparatus cannot practically form the ROM patterns about all the chips on a single wafer on the wafer or a single mask.

In view of the problems described above, the present invention aims at providing a technology that can eliminate a dedicated step for forming a pattern (ROM pattern) determining memory data of a built-in ROM on a resist film, can simplify a manufacturing process and can reduce a manufacturing cost.

It is another object of the present invention to provide a technology that can reduce the number of exposure pattern data files handled, and can expose ROM patterns of all the chips on a single wafer by using en existing electron beam exposure apparatus.

These and other objects and novel features of the present invention will become more apparent from the following description of the specification taken in connection with the accompanying drawings.

According to one aspect of the present invention, there is provided a method of designing/manufacturing a plurality of semiconductor integrated circuits having built-in ROMS each storing different data on a single wafer, wherein a pattern for determining memory data of a built-in ROM (hereinafter called "ROM pattern") is simultaneously formed by combining the pattern with a common pattern, that is common to a plurality of semiconductor circuits other than this pattern, on a resist film or a photosensitive film. In consequence, a dedicated step of forming the ROM pattern on the resist film or the photosensitive film becomes unnecessary and the manufacturing process can be simplified.

According to another aspect of the present invention, there is provided a method of designing/manufacturing a plurality of semiconductor integrated circuits having built-in ROMS each storing different data on a single wafer, comprising the steps of forming a ROM pattern for determining memory data of the built-in ROM by using the uppermost metal layer of a plurality of metal layers; combining the ROM pattern with at least part of a common pattern common to the plurality of semiconductor circuits other than the pattern into a combined connection conductor pattern; performing pattern exposure of the combined connection conductor pattern to a resist film applied to a surface of the wafer by using an electron beam exposure apparatus to simultaneously form the ROM pattern and a part of the common connection conductor pattern; and forming patterns other than the combined connection conductor pattern by using a mask. To form a plurality of semiconductor integrated circuit devices each having different data to be stored in its built-in ROM on a single wafer, a mask must be prepared for each wafer if the mask is used for forming a ROM pattern, with the result that the manufacturing cost becomes remarkably high. When pattern exposure by an electron beam apparatus is employed to form the ROM pattern, however, the cost can be drastically reduced. Moreover, because a dedicated step of forming the ROM pattern on a resist film becomes unnecessary, the manufacturing process can be simplified. Because the ROM pattern is formed from the uppermost metal layer, TAT (Turn-Around Time) can be shortened when any change must be made to the ROM pattern.

According to still another aspect of the present invention, there is provided an inspection method of a semiconductor integrated circuit device comprising a built-in ROM for storing different data, a transmitting circuit for non-contactually transmitting data to an external device and an antenna for transmission, whereby the transmitting circuit transmits memory data of the built-in ROM to outside, the inspection method comprising the steps of receiving memory data of the built-in ROM transmitted from the transmitting circuit, comparing the memory data with expected value data and judging whether or not the semiconductor integrated circuit device is normal.

BRIEF DESCRIPTION OF THE DRAWINGS

FIG. 1 flowchart showing a designing/manufacturing process of semiconductor integrated circuit devices having built-in ROMs devised and studied by the present Inventors in the course of developing the present invention;

FIG. 2 is a flowchart showing a designing/manufacturing process of semiconductor integrated circuit devices having built-in ROMs according to one embodiment of the present invention;

FIGS. 3A to 3D show exposure patterns, wherein FIGS. 3A and 3D show examples of common patterns other than ROM patterns, FIG. 3B shows an example of a ROM pattern and FIG. 3C shows an example of a combined connection conductor pattern;

FIG. 8 is a flowchart showing an exposure pattern data generation method when an existing electron beam exposure apparatus is employed to expose ROM connection conductor patterns inclusive of ROM patterns, whereby the method can also be used in the embodiments of the present invention;

DESCRIPTION OF THE EMBODIMENTS

Figure 3A:
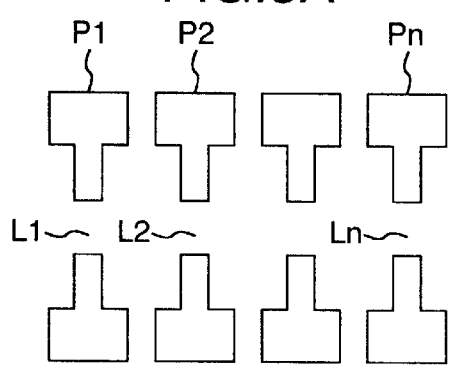

Preferred embodiments of the present invention will be described hereinafter with reference to the accompanying drawings.

FIG. 2 is a flowchart showing a designing/manufacturing process of a semiconductor integrated circuit device with a built-in ROM according to an embodiment of the present invention.

In this embodiment, there are first prepared a ROM code file RCFL storing a ROM code (e.g. as shown by 1010) to be stored in each ROM of a plurality of chips formed on a single wafer WFR and a common connection conductor pattern file CLFL storing common connection conductor pattern data of circuits other than ROM. A combined exposure pattern generation processing P100 that reads out the ROM code 1010 from the ROM code file RCFL and data of any one of metal layers (for example, the uppermost layer) of the common connection conductor pattern data from the common connection conductor pattern file CLFL is executed by using a DA (Design Automation) tool, or the like, to combine them together and to generate a combined exposure pattern. The combined exposure pattern data so generated is stored in a combined exposure pattern data file SDFL. The electron beam exposure apparatus 200 executes a pattern processing for reading out the exposure pattern data from the exposure pattern data file SDFL. The ROM pattern and the common connection conductor pattern are thus formed by the same process step, that is, by using the same metal layer, thereby completing the wafer. A test processing P300 is thereafter conducted, whenever necessary.

The pattern exposure by the electron beam exposure apparatus 200 may be either direct pattern exposure to a resist film applied to the wafer WFR or indirect exposure that once exposes a combined exposure pattern on a mask equipped with a photosensitive film and then forms a connection conductor pattern by using the mask. When the mask is used, means for generating the mask is not limited to the electron beam exposure apparatus so long as the means can generate the combined connection conductor pattern from the ROM code and the common connection conductor pattern and can produce the mask. The common connection conductor pattern to be combined with the ROM pattern is not limited to the uppermost metal layer but may be other metal layers. When the uppermost metal layer is employed, however, TAT (Turn-Around Time) can be shortened when any defect is found out in a subsequent inspection process and correction becomes necessary after the manufacture of the product.

When the ROM pattern is the made of the uppermost metal layer and its formation is effected by means of the pattern exposure using the electron beam exposure apparatus, the wafer is fabricated in advance up to the stage immediately before the formation of the uppermost layer inclusive of the ROM pattern, and the process steps after the uppermost metal layer are conducted in accordance with the ROM code on receiving the ROM code from a user. In this way, the product can be completed within a short time.

The common connection conductor pattern includes the connection conductor patterns of circuits other than the ROMs besides the common pattern for constituting the ROM to be built in each chip. When the uppermost metal layer constitutes the ROM pattern, the ROM pattern and the common conduction pattern of the circuits other than the ROM may be a power supply connection conductor, for example. In semiconductor integrated circuit devices having an antenna consisting of a later-appearing connection conductor pattern, the connection conductor pattern of the antenna can be a common connection conductor pattern combined with the ROM pattern.

Figure 3B:

This embodiment assumes the case where the circuits other than the ROM pattern for determining the memory data of the ROM are common among the chips. FIGS. 3A and 3D show common patterns for constituting the ROM. FIG. 3B shows a ROM pattern unique to each chip, and FIG. 3C shows an example of an exposure pattern after the common pattern and the ROM pattern are combined.

Figure 3C:
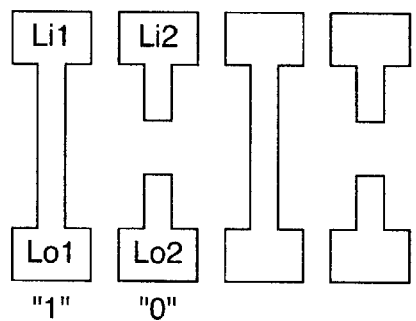
Figure 4:
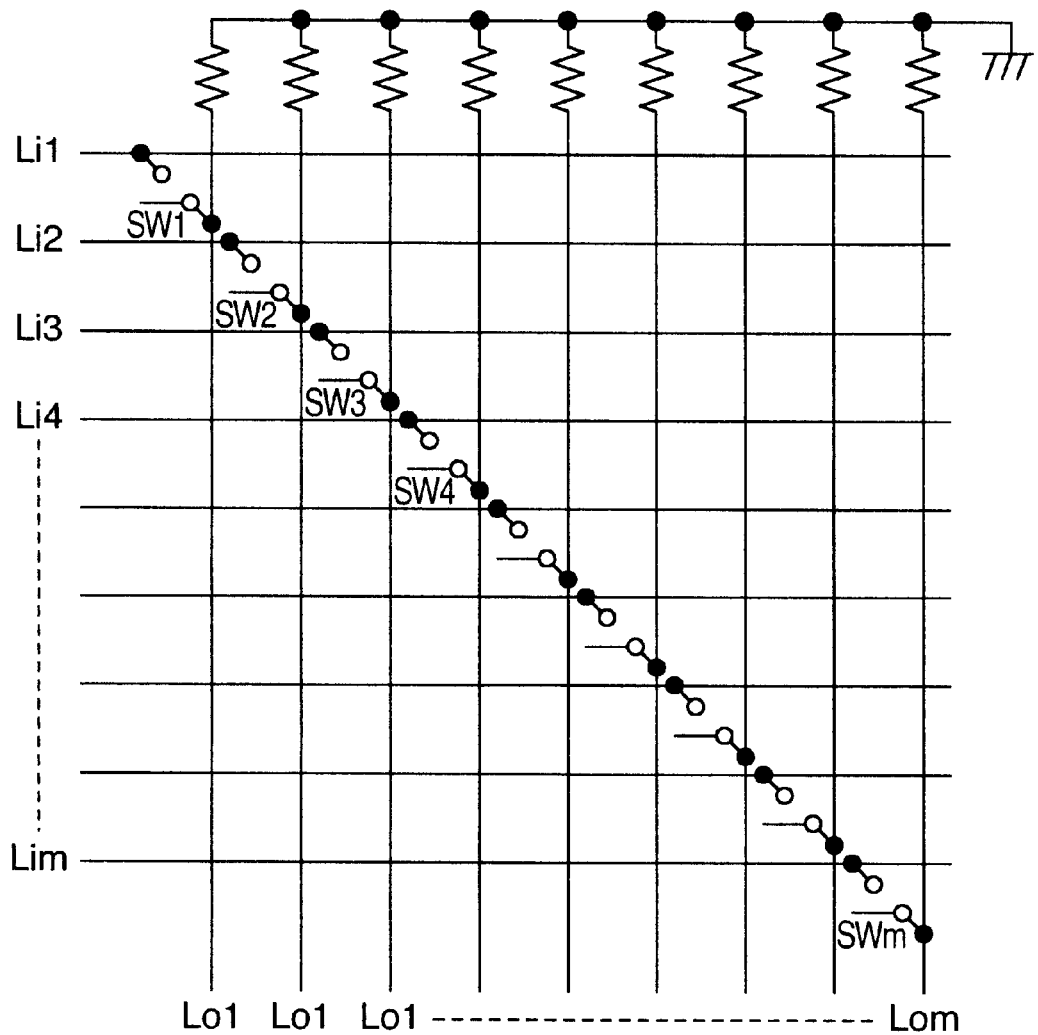
FIG. 4 is an equivalent circuit diagram showing an example of a circuit construction of built-in ROMs.

FIG. 4 shows a concrete example of a ROM having such a pattern. For example, a plurality of input lines Li1 to Lim parallel to one another and a plurality of output lines Lo1 to Lom parallel to one another are so arranged as to cross one another at right angles while they are mutually insulated. The pattern shown in FIG. 3C is disposed at each intersection. One of the terminals is connected to any of the input lines Li1 to Lim and the other terminal, to any of the output terminals Lo1 to Lom, thereby forming switches SW1, SW2, . . . , SWm shown in FIG. 4. Though the input lines Li1 to Lim and the output lines Lo1 to Lom are shown so disposed as to cross one another at right angles in FIG. 4, they may be arranged parallel to one another. When they are arranged parallel, the input lines Li1 to Lim, the output lines Lo1 to Lom and the ROM pattern can all be formed by the same metal layer.

In the ROM of this embodiment, whether or not the ROM patterns C1 and C3 are buried into the fall-off positions L1, L2, . . . , Ln of the common patterns P1, P2, . . . , Pn is determined in accordance with "1" or "0" of the binary memory data. When the common patterns are buried as shown in FIG. 3C, the patterns becomes conductive and the data "1", for example, is stored. When the common patterns are not buried, the patterns remain non-conductive and the data "0" is stored equivalently.

Figure 3D:
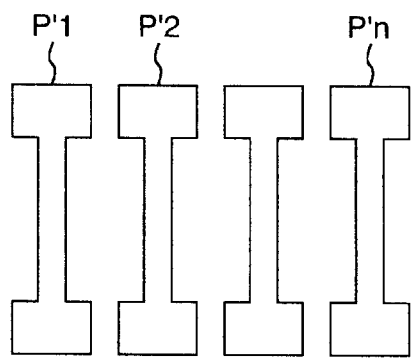

It is also possible to acquire an exposure pattern analogous to the pattern of FIG. 3C by forming beforehand all the common patterns P'1, P'2, . . . , P'n of the ROM portion into the connected state as shown in FIG. 3D and the ROM pattern corresponding to the ROM code into a punch pattern or a cut-off pattern, and to combine them together.

Figure 5:
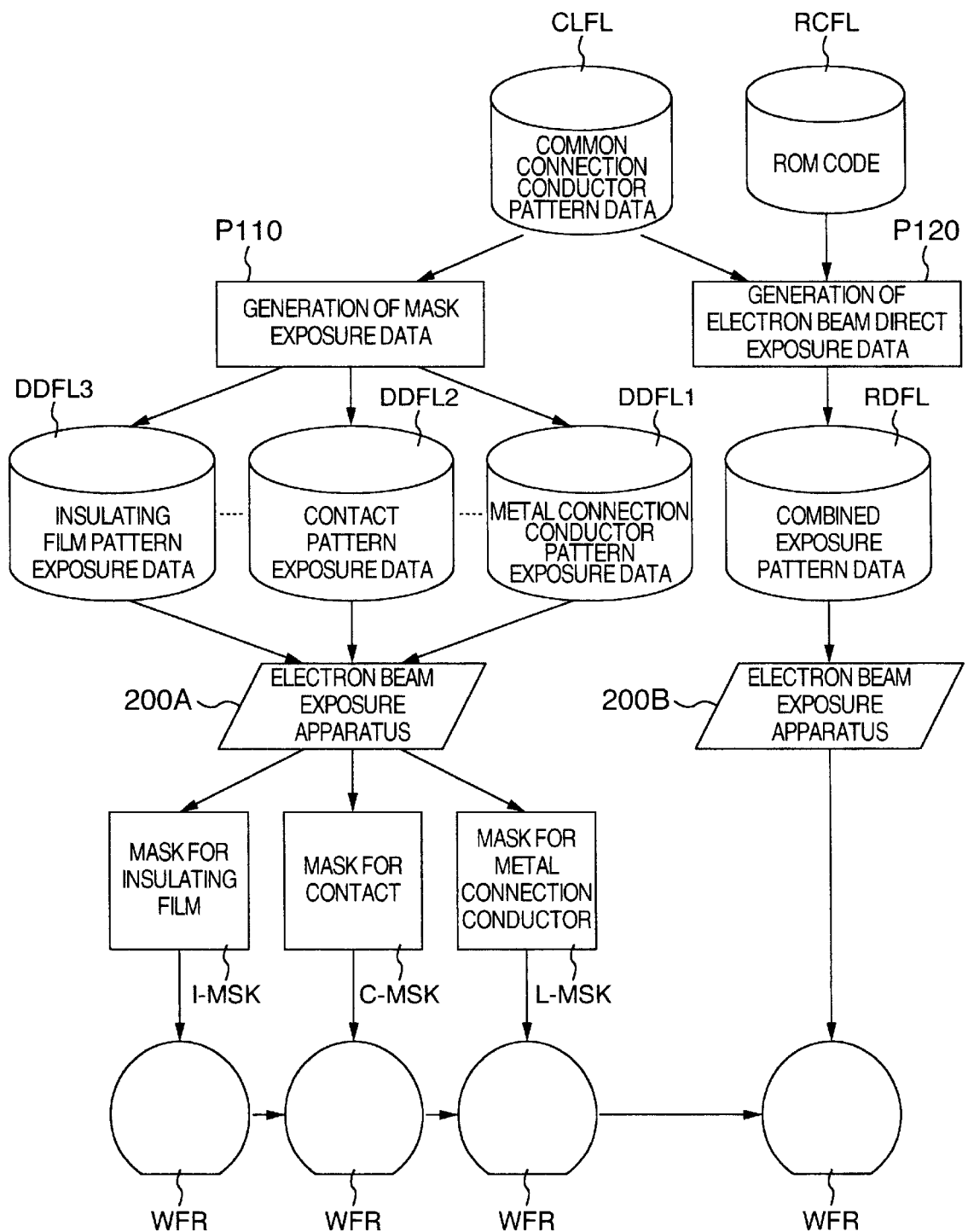
FIG. 5 is a flowchart showing a designing/manufacturing process of semiconductor integrated circuit devices having built-in ROMs according to another embodiment of the present invention.

FIG. 5 is a flowchart showing a designing/manufacturing method of a semiconductor integrated circuit device according to the second embodiment of the present invention. In this embodiment, the ROM pattern corresponding to the ROM code to be stored in the ROM of each chip and a part of the common connection conductor pattern for constituting the ROM are formed by using the uppermost metal layer by means of an electron beam direct exposure apparatus. The mask is employed to form the common connection conductor patterns of other circuits.

Here, the term "common connection conductor pattern of other circuits" includes other portions of the common connection conductor pattern for constituting the ROM other than the ROM pattern. In the ROM shown in FIG. 4, for example, the input lines Li1 to Lim and the output lines Lo1 to Lom cross one another at right angles. In this case, the input lines Li1 to Lim and the ROM pattern constituting the switches SW1 to SWm can be formed by using the uppermost metal layer while the output lines Lo1 to Lom can be formed by using a metal layer other than the uppermost metal layer (such as a third metal layer in the four-layered connection conductor). In this case, the output lines L01 to Lom correspond to the "common connection conductor pattern of other circuits" and are therefore formed by using the mask.

In the embodiment shown in FIG. 5, too, the ROM code file RCFL storing the ROM code to be stored in the ROMs of a plurality of chips formed on a single wafer and the common connection conductor pattern file CLFL storing the common connection conductor patterns of circuits other than the ROMs are prepared in advance. The common connection conductor pattern data is read out from the common connection conductor pattern CLFL. A mask exposure data generation processing P110 is then performed by using the DA tool, or the like, to generate mask exposure data for forming common connection conductor patterns other than the ROM pattern, a mask exposure data for forming contact holes and a mask exposure data for patterning an insulating film. The exposure data thus generated are stored in corresponding exposure data files DDFL1, DDFL2 and DDFL3.

On the other hand, a combined exposure pattern generation processing P120 is executed by reading out the ROM code and the common connection conductor pattern, that is a part of the common connection conductor pattern constituting the ROM and is to be formed at the same level as the ROM pattern, from the ROM code file RCFL and from the common connection conductor pattern file CLFL, respectively, and then combining them together by using the DA tool, or the like, to generate the combined exposure pattern data. The combined exposure pattern data thus generated is stored in the combined exposure pattern data file RDFL. The electron beam exposure apparatus 2008 executes a pattern processing for reading out the exposure pattern data from the exposure pattern data file RDFL and using this in the formation of the wafer WFR.

The exposure pattern data are serially read out from the exposure pattern data files DDFL1. DDFL2 and DDFL3 and are exposed to a negative film or to a positive film through the electron beam exposure apparatus 200A to generate a mask for a connection conductor L-MSK, a mask for contact C-MSK and a mask for an Insulating film I-MSK. The numbers of these masks are not one for each application but the masks are generated in the same number as the number of insulating films or metal layers.

Figure 6A:
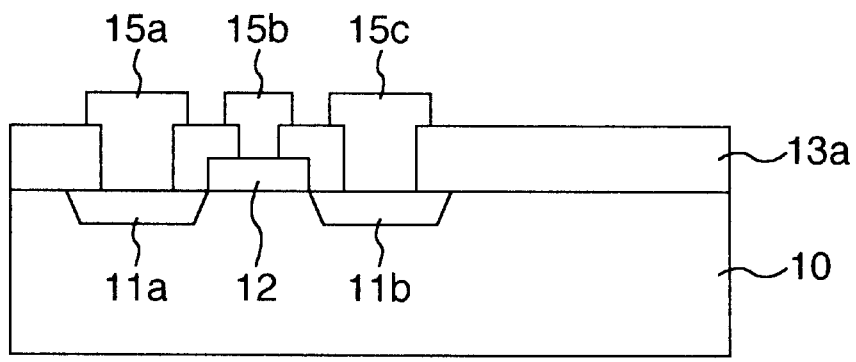
FIGS. 6A to 6C are sectional views each showing stepwise the outline of a construction of a semiconductor integrated circuit device to which the method of the embodiment shown in FIG. 5 is applied.

The insulating films and the connection conductor patterns comprising the metal layer other than the uppermost metal layer are serially formed over the wafer WFR by using the masks described above, giving the structure shown in FIG. 6A. In FIG. 6A, reference numeral 10 denotes a semiconductor substrate of single crystal silicon, for example. Reference numerals 11a and 11b denote active regions (source/drain regions) of devices (MOSFET) comprising a diffusion layer formed on the surface of the semiconductor substrate 10. Reference numeral 12 denotes an electrode (gate electrode) of the device. Reference numeral 13a denotes a first inter-layer insulating film made of silicon oxide or silicon nitride. Reference numerals 15a, 15b and 15c denote connection conductor patterns comprising a metal layer of aluminum, or the like, and connected to the active regions 11a, 11b and the electrodes 12 through contact holes formed in the inter-layer insulating film 13a. In FIG. 6A, the connection conductor patterns 15a, 15b and 15c comprising the metal layer other than the uppermost metal layer and the inter-layer insulating film 13a are shown as a single layer in the simplified form, but each of them has a laminate structure of two or more layers in some cases.

Figure 6B:
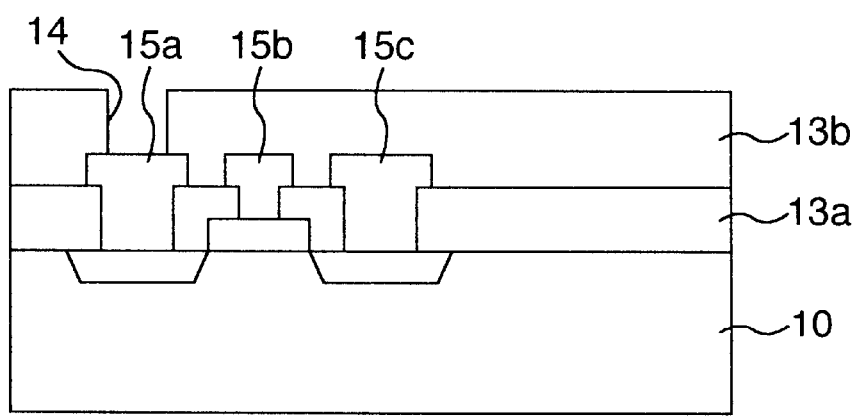
Figure 6C:
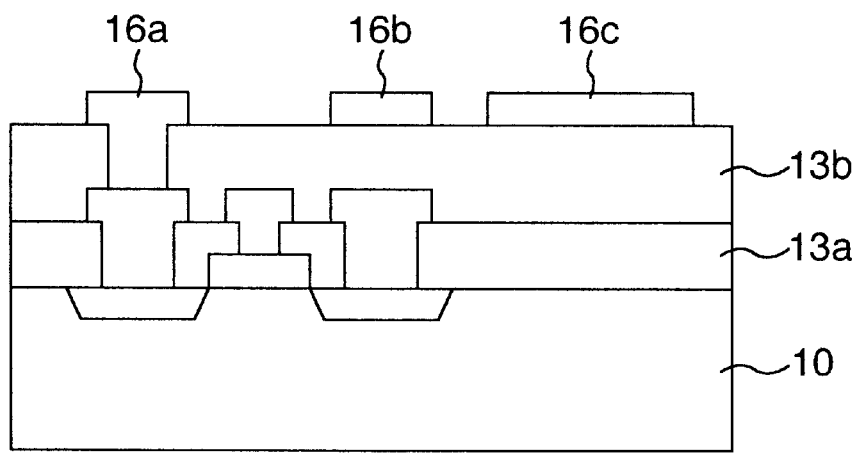

Next, the second inter-layer insulating film 13b is formed before the uppermost metal layer is formed. Contact holes 14 are then formed in the inter-layer insulating film 13b if any positions exist in the uppermost metal layer that are to be connected to any of the lower metal layers 15a to 15c, as shown in FIG. 6B. To form the uppermost metal layer, the electron beam exposure apparatus 200B reads out the exposure pattern data from the combined connection conductor exposure pattern data file SDFL and executes a direct pattern exposure processing to the resist film applied to the wafer surface. In this way, the ROM pattern and the patterns 16a, 16b and 16c of the uppermost layer as a part of the common connection conductor pattern that constitute the ROM are obtained as shown in FIG. 6C.

Incidentally, reference numerals 16a, 16b and 16c in FIG. 5C denote the connection conductor pattern comprising the uppermost metal layer. The connection conductor patterns 16a and 16b among them are the common connection conductor patterns that are common among the chips (the power supply line for supplying the power source voltage Vcc and the ground potential to the devices, for example). Reference numeral 16c denotes the ROM pattern. After the uppermost metal layer is formed, a connection conductor pattern for an antenna is formed on the insulating film for the chip having the antenna, and an opening is formed at each pad portion of a passivation film for the chip having bonding pads. The device is thus completed. Incidentally, the connection conductor pattern for the antenna may be formed in the uppermost layer that is the same as the ROM pattern.

Figure 7:
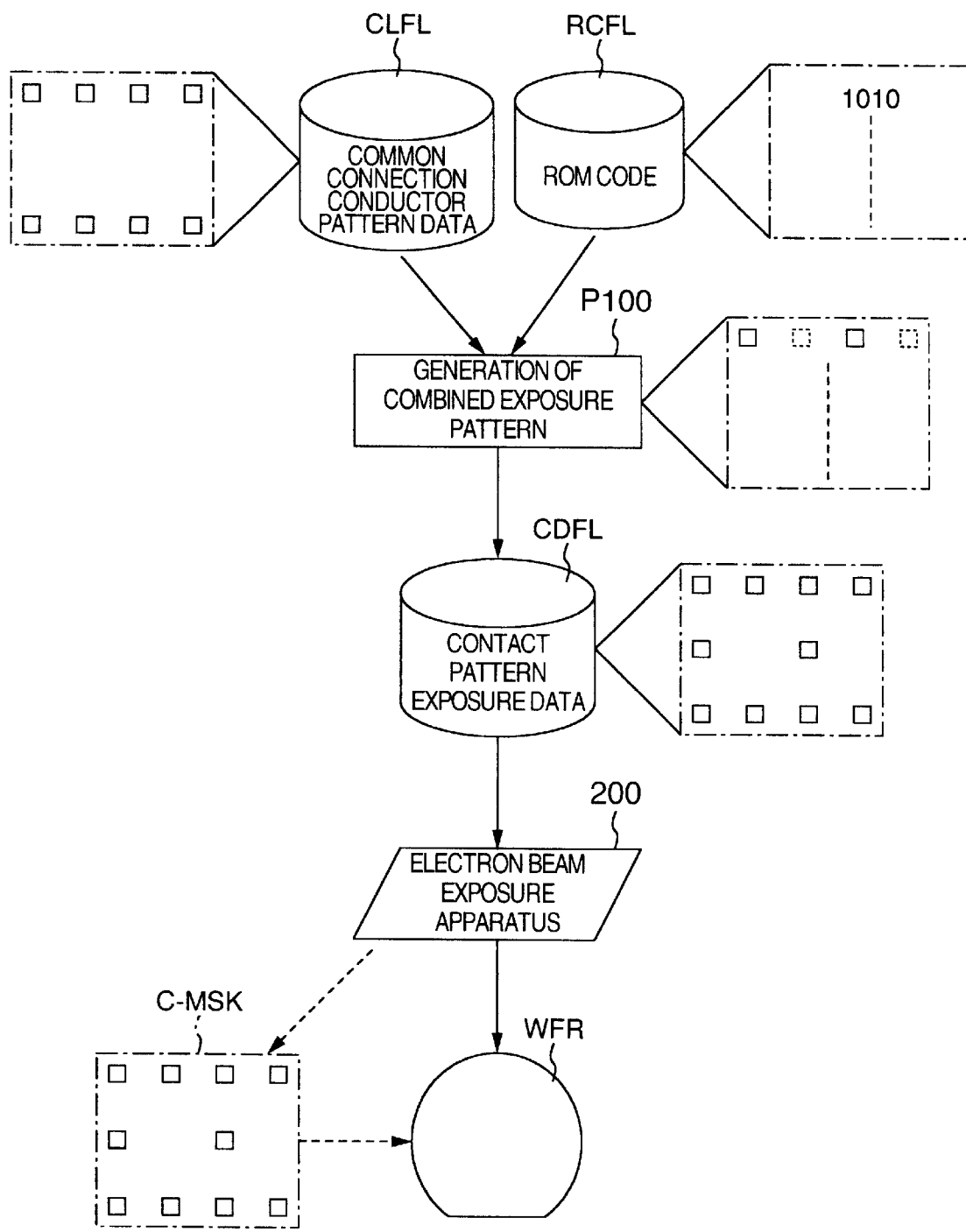
FIG. 7 is a flowchart showing a designing/manufacturing process of semiconductor integrated circuit devices having built-in ROMs according to still another embodiment of the present invention.

FIG. 7 is a flowchart showing a designing/manufacturing process of a semiconductor integrated circuit according to the third embodiment of the present invention. This embodiment is different from the first and second embodiments in the structure of the ROM to be assembled into the chip. This embodiment is applied to a ROM for storing data wherein a contact hole (contact hole conductor) corresponding to the ROM code is either formed or not formed at each intersection between the input line Li1 to Lim and the output line Lo1 to Lom so arranged as to cross one another as shown in FIG. 4, for example, instead of the construction for storing data in which the ROM pattern corresponding to the ROM code connects, or does not connect, the input line and the output line.

In this embodiment, a pattern generation processing P100 is executed by using the DA tool, or the like, for reading the RUM code 1010 from the RUM code file RCFL and contact hole data (for example, the contact hole data farmed in the insulating film immediately below the uppermost metal layer) formed in any one of a plurality of insulating films in the circuit portions other than the ROM from the common connection conductor pattern to generate the combined pattern exposure data comprising the combination of the ROM code and the contact hole data. The combined contact hole exposure data is stored in the combined exposure pattern data file CDFL. The electron beam exposure apparatus 200 reads out the combined contact hole exposure pattern data from the file CDFL and executes direct exposure to the mask C-MSK for farming the contact holes or the resist film on the surface of the wafer, forming simultaneously the contact holes for the RUM and the contact holes for other portions by the same process step.

In this embodiment, too, the preparation of the mask is not limited to the electron beam exposure apparatus and other apparatuses can be used, too, so long as the apparatuses can produce the combined contact hole pattern from the ROM code and the common pattern data other than the ROM to produce the mask. The formation positions of the contact holes for the ROM and the contact holes of circuits other than the ROM are not limited to the insulating film immediately below the uppermost metal layer but may well be the insulating films of the lower layers. However, the higher the layer of the insulating film, the shorter becomes the TAT (Turn-Around Time) for correcting any defect when the defect is found out during inspection after fabrication. Incidentally, the term "contact holes other than those of ROM" in this embodiment includes contact holes for the connection with built-in ROMs other than the contact holes for deciding the ROM memory data. A concrete example is the contact holes for connecting the input line L1 to Lim and the output line Lo1 to Lom of the ROM shown in FIG. 4 and for connecting these lines to signal lines for the connection with other circuits.

FIG. 8 is a flowchart illustrating an example of a rational exposure pattern data generation method when an existing electron beam exposure apparatus is employed to expose patterns each inclusive of a common connection conductor pattern and a ROM pattern combined with each other. When a wafer is considerably great, the existing electron beam exposure apparatus cannot finish at one time the pattern exposure to the entire part of the wafer. Therefore, the electron beam exposure apparatus has to conduct pattern exposure while moving step-wise a stage supporting thereon the wafer or a film as a mask. In such a case, it would be possible to conduct pattern exposure in a chip unit, but when the number of chips mounted to a single wafer is as great as 50,000 to 600,000, pattern exposure in the chip unit is not practically efficient because the number of times of step movement of the stage increases.

Figure 9A:
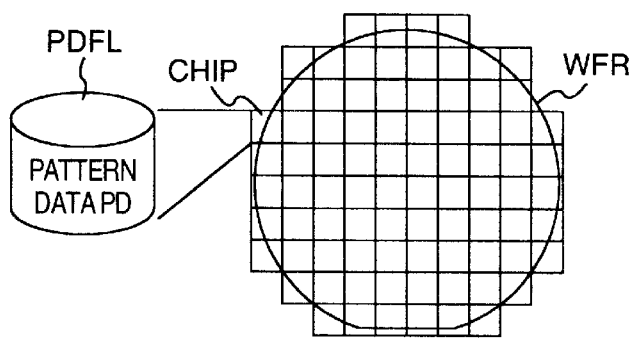
FIGS. 9A to 9D show data structural examples of files in the embodiment shown in FIG. 7.

Therefore, this embodiment improves pattern exposure efficiency by the electron beam exposure apparatus by generating exposure pattern data by putting together connection conductor patterns of a plurality of chips, storing the exposure pattern data and handing it over to the electron beam exposure apparatus. In this embodiment, therefore, pattern data files PDFL1, PDFL2, . . . , PDFLn storing all the pattern data PD of connection conductors inside chips, contact holes, insulating films, etc, for each of a plurality of chips CHIP mounted to a single wafer WFR shown in FIG. 9A are prepared in advance. These files PDFL1, PDFL2, . . . , PDFLn contain the combined exposure patterns of the ROM pattern and the common pattern generated by the pattern generation apparatus explained in the foregoing embodiment.

Figure 9B:
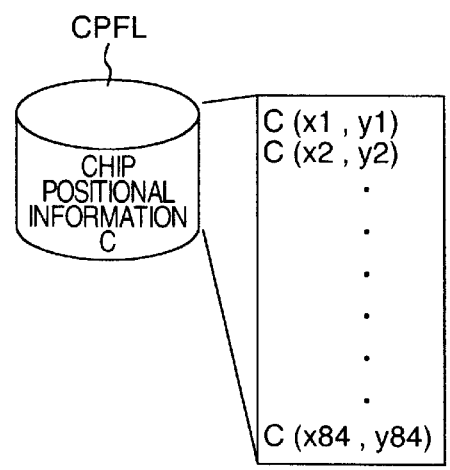
Figure 9C:
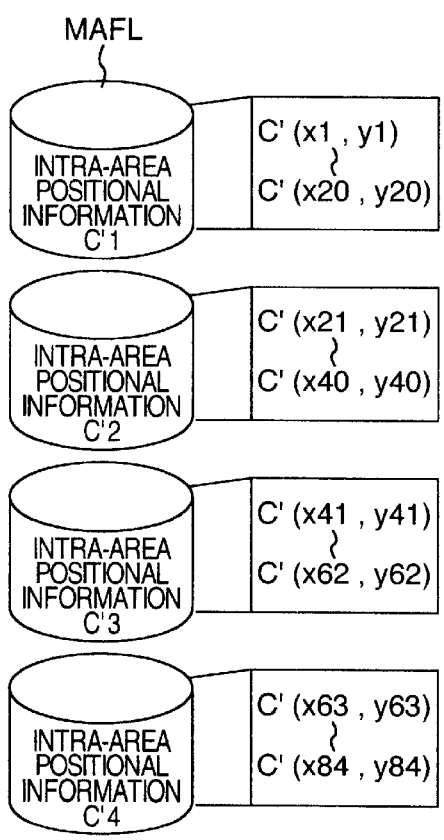
Figure 9D:
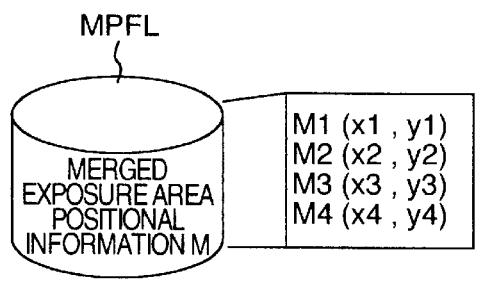
Figure 10:
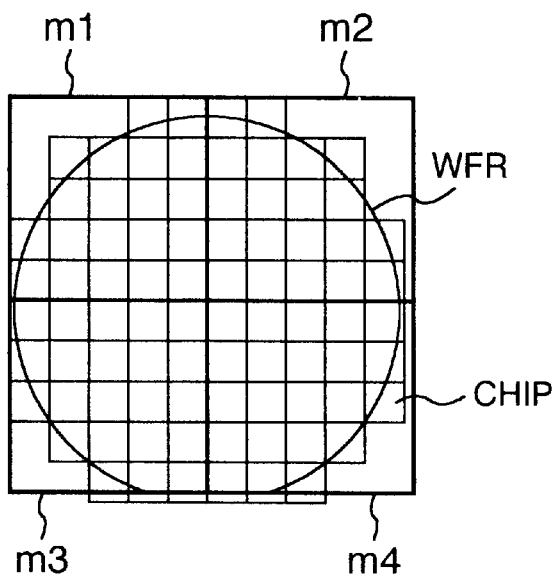
FIG. 10 shows an example of a way of division when the wafer in the embodiment shown in FIG. 7 is divided into a plurality of areas.

A chip positional information file CPFL storing chip positional information C(x1, y1) to C(xn, yn) representing the position of each chip on the wafer is prepared separately from the file PDFL1, PDFL2, . . . , PDFLn for each chip described above. First, the number of chips to be exposed at one time, that is, a merged exposure area m1 to m4, is determined from the chip positional information C, the size of one chip and the maximum pattern exposure range of the electron beam exposure apparatus as shown in FIG. 10, for example. Referring back to FIG. 8, an area positional information generation processing P130 is executed for generating intra-area positional information C'(x1, y1) to C'(x84, y84) (FIGS. 9B and 9C) and area positional information M1(x1, y1) to M4(x4, y4) (FIG. 9D) representing the position of each area on the wafer WFR for each of the merged exposure areas m1 to m4. The information so generated is stored in a separate area positional information file MAFL. MPFL (refer to FIGS. 9C and 9D). Position of each area m1 to m4 on the wafer WFR can be expressed as the coordinates of the center of each area in the X-Y coordinates system having the wafer center as the origin, for example. Incidentally, a single wafer is shown divided into four merged exposure areas m1 to m4 for simplifying the illustration in FIG. 10, but the wafer is divided into a greater number of areas in some cases.

Next, a processing P140 in FIG. 8 is executed in the following way. Intra-area positional information is read out from the intra-area positional information file MAFL and chip identification information belonging to that area is acquired. The connection conductor pattern data of the uppermost layer inclusive of the ROM patterns of a plurality of chips are read out from the corresponding pattern data files PDFL1, PDFL2, . . . , PDFLn on the basis of this chip identification information. The DA tool, or the like, arranges and splices these connection conductor pattern data in accordance with the chip positions inside the areas and generates the merged exposure pattern data. Generation of such exposure pattern data is executed for each merged exposure pattern area M1 to M4, and the exposure pattern data so generated is stored in the exposure pattern data file DDFL.

On the other hand, an arrangement data generation processing P150 is executed for reading out the merged exposure area positional information M from the area positional information file MPFL and for generating the positional data representing the position of the area on the wafer, that the electron beam exposure apparatus can read, from the positional information of each merged exposure area M1 to M4. The arrangement data so generated is stored in the arrangement data file ADFL.

Thereafter, the electron beam apparatus 200 reads the exposure pattern data from the exposure pattern data file DDFL and the arrangement data from the arrangement data file ADFL, and executes the direct pattern exposure processing to the resist film applied to the surface of the wafer WFR or the pattern exposure processing to the film for the mask MSK.

Next, a method of storing the data into the pattern exposure data file DDFL will be explained.

Figure 11:
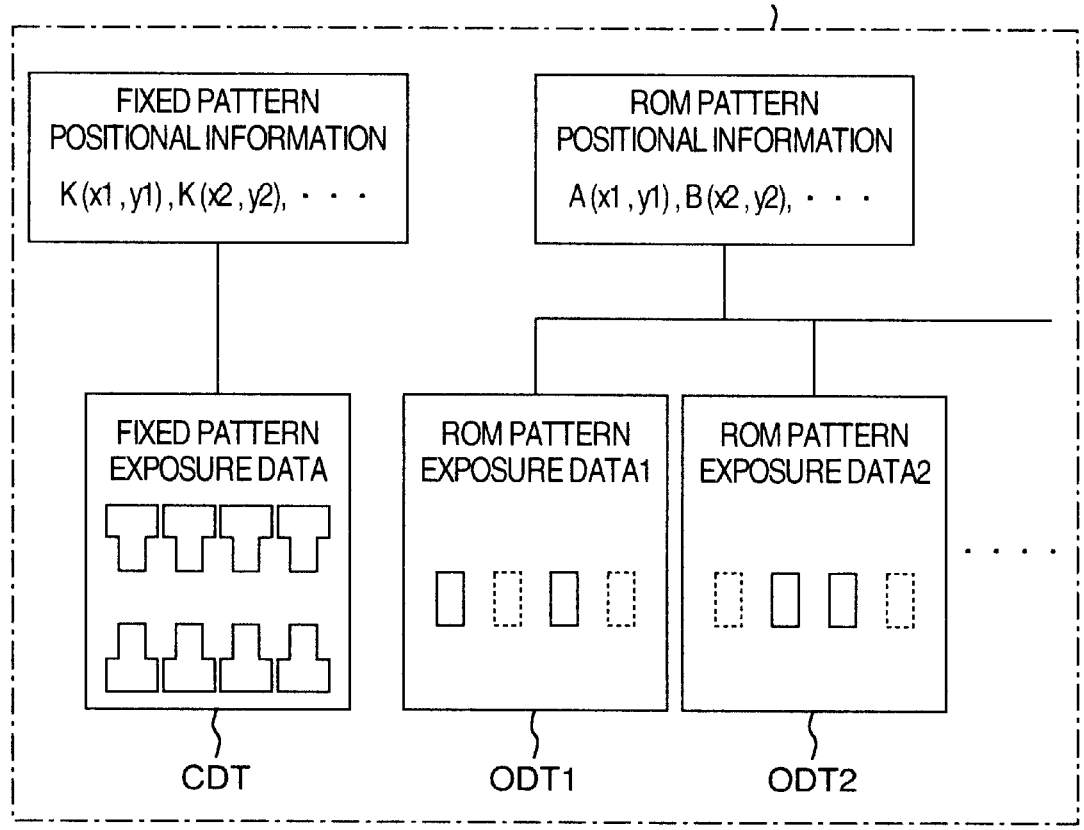
FIG. 11 shows a structural example of an exposure data file that can be used in the embodiments of the present invention.

The connection conductor pattern data of all the chips on a single wafer is stored in the pattern exposure data file DDFL. Therefore, when the number of chips on the single wafer is as great as 500,000, for example, the quantity of the pattern exposure data stored in the pattern exposure data file DDFL becomes enormous, too. Consequently, in this embodiment, ROM pattern exposure data ODT1, ODT2, etc, that are unique to individual chips, and fixed pattern exposure data CDT common to each chip, are stored in separate memory areas inside the pattern exposure data file DDFL as shown in FIG. 11. Positional information A(x1, y1), B(x2, y2), etc, representing the positions at which the ROM pattern exposure data ODT1, ODT2, etc, are to be arranged and positional information K(x1, y1), K(x2, y2), etc, representing the positions at which fixed pattern positional information CDT are to be arranged, too, are stored in the pattern exposure data file DDFL in such a way as to correspond to the respective exposure pattern data.

In this way, storage of overlapping data can be omitted, and the capacity of the data file and eventually, the capacity of the memory device used, can be reduced.

Figure 12:
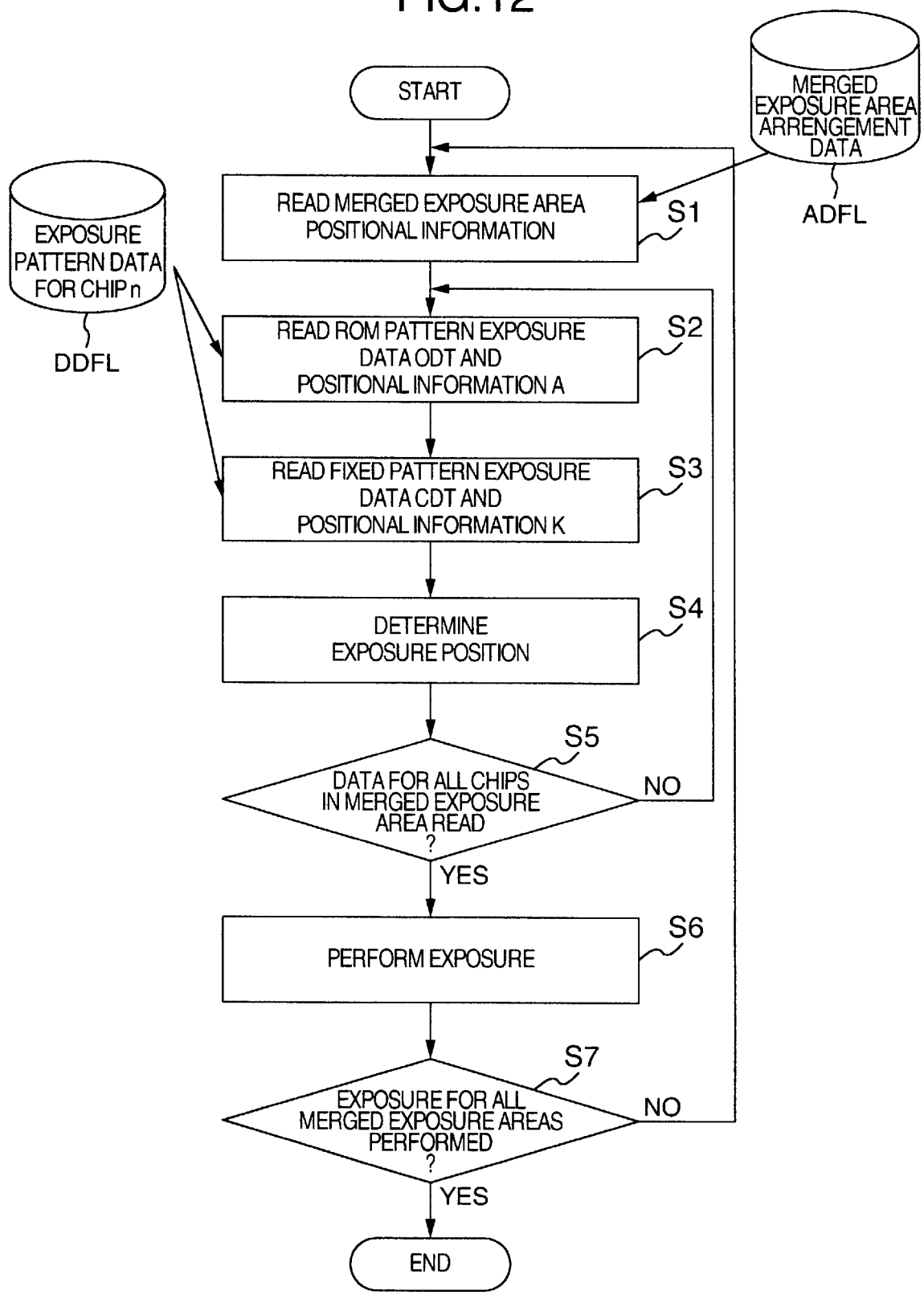
FIG. 12 is a flowchart showing an example of a pattern exposure processing in an electron beam exposure apparatus using the exposure data file constituted as shown in FIG. 11.

According to this method, however, the processing shown in FIG. 12 must be executed while the pattern exposure data are being combined when the electron beam exposure apparatus executes the pattern exposure processing in practice. FIG. 12 shows the exposure processing executed by the electron beam exposure apparatus on the basis of the pattern exposure data stored in the pattern exposure data file DDFL as shown in FIG. 11.

In the series of the processing steps, the positional information of the first merged exposure area M1 is first read from the merged exposure area arrangement data file ADFL (step S1). Next, the ROM pattern exposure data ODTi of a specific chip and its positional information A(xi, yi) are read from the pattern exposure pattern data file DDFL (step S2). Subsequently, the fixed pattern exposure data CDT and its positional information K(xi, yi) are read from the pattern exposure data file DDFL (step S3). The ROM pattern exposure data ODTi and the fixed pattern exposure data CDT are combined, and the exposure position on the wafer is determined (step S4). Thereafter, whether or not the read operation of the pattern exposure data of all the chips inside one merged exposure area is finished is judged (step S5). If it is not yet finished, the flow returns to the step S2 and the ROM pattern exposure data ODTi+1 of the next chip and its positional information A(xi+1, yi+1) are read.

After the steps S2 to S5 described above are repeated and the pattern exposure data of all the chips inside one merged exposure area is completed, the flow shifts to the step S6 and pattern exposure is performed on the basis of the pattern exposure data so read. Whether or not the pattern exposure is finished for all the merged exposure areas on one wafer is judged at the step S7. If it is not yet finished, the flow returns to the step S1, and the pattern exposure data and the positional information of all the chips of the next merged exposure area are serially read, followed then by pattern exposure. When the pattern exposure is judged as being finished for all the merged exposure areas at the step S7, a series of the pattern exposure processing are finished.

In the embodiment described above, the wafer is divided into a plurality of areas in accordance with the maximum pattern exposure range of the electron beam exposure apparatus, and pattern exposure of a plurality of chips is performed for each area. When aberration of a lens in an exposure apparatus varies depending on the positions of the wafers (such as the center and periphery) or when the degree of progress of etching varies with an etching solution or an etching gas depending on the positions of the wafer (upper or lower position) besides the electron beam exposure apparatus, it is advisable to similarly divide the wafer into a plurality of areas and to correct each pattern and then to perform pattern exposure so as to minimize a processing error in each area.

Figure 13:
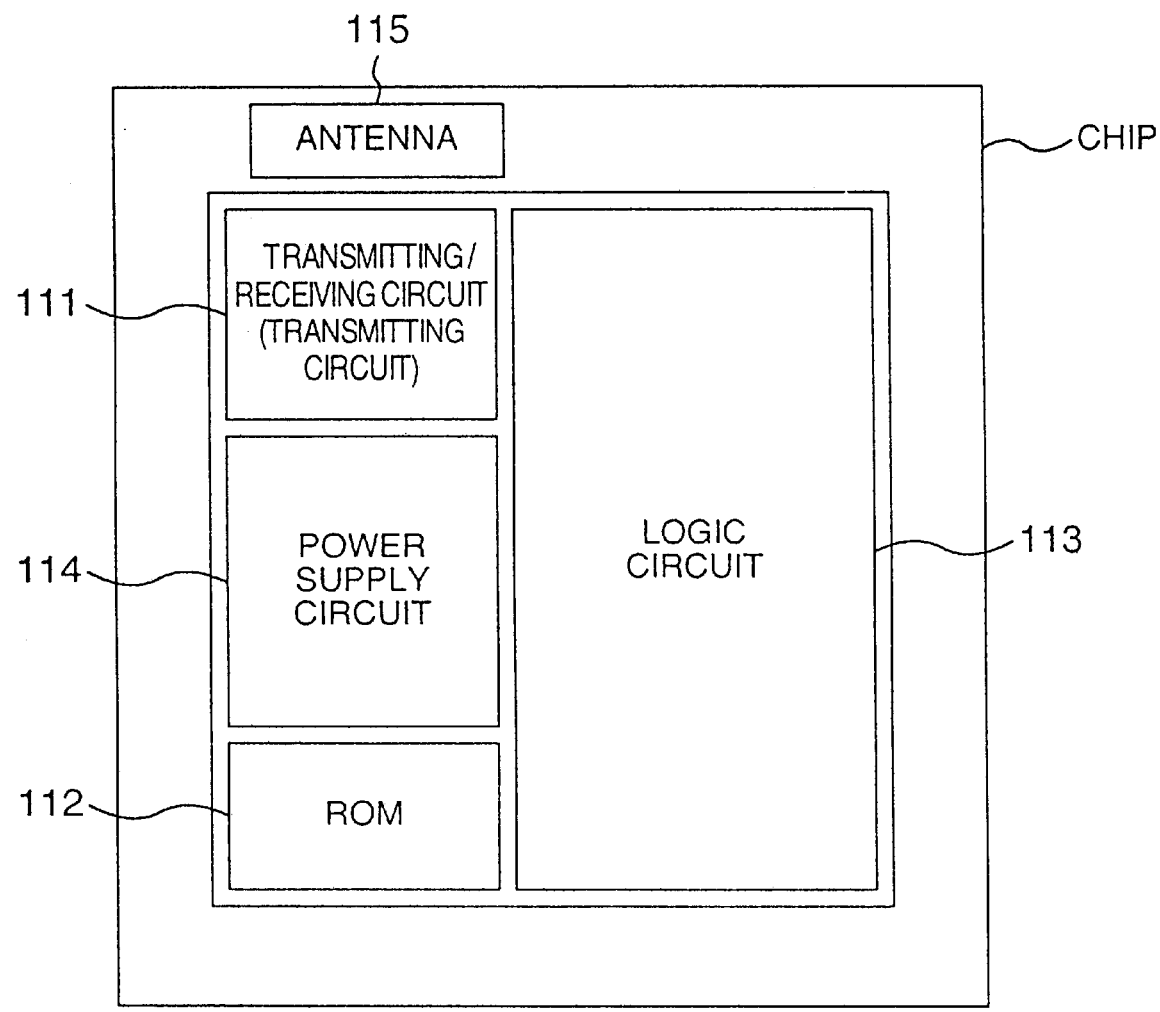
FIG. 13 is a block diagram showing an example of a semiconductor integrated circuit device according to still another embodiment of the present invention.

Next, a preferred example of a semiconductor integrated circuit device, to which the present invention is applied, will be explained with reference to FIG. 13. The semiconductor device of this embodiment includes a transmitting/receiving circuit 111 that transmits data to an external device, a built-in ROM 112 that stores predetermined data such as the above-mentioned ROM code, a logic circuit 113 that reads out the data from the built-in ROM 112 in accordance with a request from outside, outputs the data through the transmitting/receiving circuit 111 and performs a predetermined processing, and a power supply circuit 114 that supplies a power supply voltage to each of these circuits 111 to 113.

The semiconductor integrated circuit of this embodiment is equipped with an antenna 115 for transmitting the data to an external device, though this construction is not particularly restrictive. The transmitting/receiving circuit 111 is so constituted as to drive this antenna 115. The power supply circuit 114 may well be a battery, for example, but in this embodiment, an A.C. signal inputted from outside through the antenna 115 is rectified by using a diode bridge, or the like, to generate an internal D.C. power supply voltage. A connection conductor having a predetermined pattern is employed to form the antenna 115 at the peripheral portion of the chip or over the circuit part while it is electrically insulated from the circuit devices by an insulating film.

The application of the semiconductor integrated circuit having such a function includes a chip that outputs a code stored in the ROM in place of a bar code attached at present as a tag to merchandise and a chip built in an electronic key and outputting a key code when inserted into a keyhole. In the semiconductor chips used for such applications, the code or data stored in the built-in ROM must be different from chip to chip. Therefore, when the designing/manufacturing method of this embodiment is employed to manufacture the chips, it is extremely effective to reduce the cost.

Incidentally, in the case of the semiconductor integrated circuit device having the application described above, the transmitting/receiving circuit 111 shown in FIG. 12 has only the transmission function and need not have the receiving function. However, this circuit 111 may be provided with the function of receiving signals from external device. In this case, the circuit 111 can be so constituted as to transmit the data in accordance with the request from the external device. When the circuit 111 has only the transmitting function, on the other hand, the semiconductor integrated circuit may be constituted in such a fashion as to repeat the following operations until an A.C. signal as the power supply source is no longer supplied. Namely, the power supply circuit 114 generates an internal power supply voltage upon receiving the A.C. signal from the antenna 115, the logic circuit 113 then operates to generate a clock signal, reads out the code from the built-in ROM and sends it to the transmitting circuit 111, and the transmitting circuit 111 drives the antenna 115 and transmits the signal to outside.

The power supply circuit 114 described above may be of a system that receives the supply of power by utilizing the induction phenomenon of a coil used in a non-contact type IC card, or the like. In this case, the antenna 115 can be constituted by a spiral connection conductor pattern, for example.

As typified by this embodiment, the semiconductor integrated circuit with a built-in ROM having the transmitting circuit 111 and the antenna 115 can perform a test processing P300 of the built-in ROM shown in FIG. 2 by utilizing the transmitting circuit 111 and the antenna 115. When an A.C. signal as a power source is applied to a manufactured chip, the transmitting circuit 111 inside the chip automatically transmits the data stored in the built-in ROM. Therefore, when this data is compared with expected value data, it is easily possible to inspect whether or not the built-in ROM correctly stores the desired code. Though this test can be conducted under the wafer state, it can also be conducted during conveying of the chips by a belt conveyor after the wafer is diced into the chips.

During this test, there occurs the case where the built-in ROM does not have any defect but the normal code cannot be received due to the defect of the transmitting circuit or the logic circuit. In the chips for the application described above, however, it is not necessary to clarify which circuit has the defect, but is only necessary to eventually reject the chips that do not output the normal code. Therefore, the testing method described above may suffice the object.

The invention completed by the present inventors has thus been explained concretely on the basis of several preferred embodiments thereof. However, the present invention is not particularly limited to these embodiments but can of course be changed or modified in various ways without departing from the scope of the invention. For example, the embodiments perform the pattern exposure to the mask, but they can likewise be applied to the pattern exposure to a reticle.

The foregoing description has principally explained the invention completed by the inventors about its application to the designing/manufacturing method of the semiconductor integrated circuit device with built-in ROMs storing different data for each chip as the background and the field of utilization of the invention, but the present invention can be broadly applied to designing/manufacturing of semiconductor integrated circuit devices having a different pattern for each chip other than ROM.

What is claimed is:

1. A method of designing/manufacturing a plurality of semiconductor integrated circuits having built-in ROMS each storing different data on a single water, comprising the step of:

preparing a common pattern to said plurality of semiconductor integrated circuits;

combining a unique pattern for determining memory data for each of said built-in ROMs with said common pattern to generate a combined exposure pattern; and forming a combined pattern for forming said plurality of semiconductor integrated circuits having said built-in ROMs on said wafer or on a mask to be used with said wafer by use of said combined exposure pattern.

2. A method of designing/manufacturing a plurality of semiconductor integrated circuit devices according to claim 1, wherein said unique pattern for each of said built-in ROM is for a metal layer for a connection conductor.

3. A method of designing/manufacturing a plurality of semiconductor integrated circuit devices according to claim 1, wherein said unique pattern for each of said built-in ROMs is for a contact hole formed in an insulating film, for electrically connecting an upper metal layer to a lower metal layer.

4. A method of designing/manufacturing a plurality of semiconductor integrated circuit devices according to claim 2, wherein said unique pattern for each of said built-in ROMs is for an uppermost metal layer of a plurality of metal layers.

5. A method of designing/manufacturing a plurality of semiconductor integrated circuit devices according to claim 1, wherein formation of said unique pattern for each of said built-in ROMs is performed in an electron beam exposure apparatus by pattern exposure of a resist film applied to a surface of the wafer.

6. A method of designing/manufacturing a plurality of semiconductor integrated circuit devices according to claim 1, wherein formation of said unique pattern for each of said built-in ROMs is performed in an electron beam exposure apparatus by pattern exposure of a mask used for transferring said pattern to the wafer.

7. A method of designing/manufacturing a plurality of semiconductor integrated circuits according to claim 1, wherein the wafer is divided into a plurality of areas in accordance with an apparatus used for designing/manufacturing said semiconductor integrated circuit devices, and formation of said unique pattern for each of said built-in ROMs for a plurality of semiconductor integrated circuits belonging to each of said areas is conducted simultaneously with formation of a pattern that is common to a plurality of semiconductor integrated circuits other than said unique pattern.

8. A method of designing/manufacturing a plurality of semiconductor integrated circuits according to claim 7, wherein pattern exposure data for a pattern to be formed on each of said plurality of areas includes pattern exposure data for a common portion, positional information on said pattern exposure data for the common portion on the wafer at which it is to be disposed, pattern exposure data unique to each of said semiconductor integrated circuits and positional information of said pattern exposure data unique to each semiconductor integrated circuit on the wafer at which it is to be disposed.

9. A method of designing/manufacturing a plurality of semiconductor integrated circuits having built-in ROMs each storing different data on a single wafer, comprising the steps of:

forming a unique pattern for determining memory data for said built-in ROMs for an uppermost metal layer of a plurality of metal layers;

combining said unique pattern with a common pattern common to said plurality of semiconductor circuits other than said specific pattern to generate a combined exposure pattern;

performing, by use of said combined exposure pattern, pattern exposure of a resist film applied to a surface of the wafer in an electron beam exposure apparatus for forming said plurality of semiconductor integrated circuits having said built-in ROMs; and forming patterns other than said combined unique pattern and said common pattern by using a mask.

10. A method of designing/manufacturing a plurality of semiconductor integrated circuits according to claim 9, wherein the wafer is divided into a plurality of areas in accordance with an apparatus used for designing/manufacturing said semiconductor integrated circuits, and formation of said unique pattern for said built-in ROMs for a plurality of semiconductor integrated circuits belonging to each of said areas is conducted simultaneously with formation of a pattern that is common to a plurality of semiconductor integrated circuits other than said unique pattern.

11. A method of designing/manufacturing a plurality of semiconductor integrated circuits according to claim 10, wherein pattern exposure data for a pattern to be formed on each of said plurality of areas includes exposure pattern data for a common portion positional information on said pattern exposure data for the common portion on the wafer at which it is to be disposed, pattern exposure data unique to each of said semiconductor integrated circuits and positional information of said pattern exposure data unique to each semiconductor integrated circuit on the wafer at which it is to be disposed.

12. A method of forming a plurality of semiconductor integrated circuit devices of chips on a single semiconductor wafer, each of said semiconductor integrated circuit devices having a ROM and an electric circuit cooperative therewith the ROM in the integrated circuit device in each chip storing information unique to the chip and distinct from information stored in the ROM in another semiconductor device on another chip, the method comprising the steps of:

preparing a common connection conductor pattern which may be used for formation of the electric circuits on the chips in common and a ROM pattern determining information unique to a chip;

combining said common connection conductor pattern and said ROM pattern into an exposure pattern; and performing exposure by use of said exposure pattern into which said common connection conductor pattern and said ROM pattern are combined for forming said plurality of semiconductor integrated circuit devices on said chips on said wafer.

13. A method according to claim 12, wherein said exposure is performed on a resist film of said wafer for direct exposure thereon.

14. A method according to claim 12, wherein said exposure is performed on a photosensitive film for formation of a mask to be used with said wafer.

* * * * *